United States Patent [19]

Albert et al.

[11] Patent Number: 5,656,958

[45] Date of Patent: Aug. 12, 1997

[54] FREQUENCY SYNTHESIZING DEVICE

[75] Inventors: Patrick Albert, Maisons Alfort; Alain Vergnes, Corbeil-Essonnes; Bertrand Salle, Versailles, all of France

[73] Assignee: Lucent Technologies Inc., Murray Hill, N.J.

[21] Appl. No.: 352,410

[22] Filed: Dec. 8, 1994

[30] Foreign Application Priority Data

Dec. 15, 1993 [FR] France ................... 93 15072

[51] Int. Cl.$^6$ ................... H03L 7/18; G06F 7/38
[52] U.S. Cl. ................... 327/105; 327/117; 327/113; 377/48; 364/721
[58] Field of Search ................... 327/105, 107, 327/115, 117, 113, 141, 150, 159, 248, 106; 364/721, 718; 377/78, 47, 48, 7, 2

[56] References Cited

U.S. PATENT DOCUMENTS

| | | | |
|---|---|---|---|
| 3,882,403 | 5/1975 | Gerken | 327/107 |
| 4,031,476 | 6/1977 | Goldberg | 328/39 |
| 4,216,463 | 8/1980 | Backof, Jr. et al. | 327/7 |
| 4,423,381 | 12/1983 | Stepp et al. | 327/107 |
| 4,514,696 | 4/1985 | Genrich | 327/107 |
| 4,559,613 | 12/1985 | Murphy et al. | 364/703 |
| 4,580,277 | 4/1986 | Angello et al. | 375/67 |
| 4,815,018 | 3/1989 | Reinhardt et al. | 364/701 |
| 5,398,031 | 3/1995 | Saji | 327/115 |

OTHER PUBLICATIONS

Tung Sun Tung "Exclusive OR Gate and Flip–Flops Make Half–Integer Divider", Electronics, vol. 51, No. 2, Jan. 19, 1978 pp. 109–110.

Proceedings of the 39th Annual Frequency Symposium 1985, 29–31 May 1985, Philadelphia, PA, USA, 1985 IEEE, New York, pp. 189–192; C. Richardson "A Novel Synthesiser for Miniature SSB Radio Equipment".

*Primary Examiner*—Timothy P. Callahan
*Assistant Examiner*—Dinh T. Le

[57] ABSTRACT

A frequency synthesizer device has an input port for a digital code which defines the frequency to be synthesized and an accumulator circuit for successively counting the digital codes in the form of numbers in time with signals of an accumulation clock. An accumulation decoder is coupled to the accumulator circuit and supplies accumulation information relating to the counted number in the accumulator circuit. A variable divider circuit is controlled by this accumulation information to supply the synthesized frequency signals based upon the signals of a reference clock.

5 Claims, 2 Drawing Sheets

FREQUENCY SYNTHESIZING DEVICE

BACKGROUND OF THE INVENTION

The present invention relates to a frequency synthesizing device having an input access for a digital code which defines the frequency to be synthesized and an accumulator circuit for successively counting the digital codes, in the form of numbers, in time with signals of an accumulation clock.

A device of this type finds important applications, especially in the field of data transmission where the carrier frequency of the data is to be established with very great precision.

A device of this type is known from U.S. Pat. No. 4,514,696.

This device produces an output frequency $f_u$ based upon an N-bit digital code C:

$$f_u = C \times F_R/2^N$$

where $F_R$ is the frequency of the signals of a reference clock preferably formed, as is common practice, by a quartz crystal. From this formula is derived the variation step $\Delta f$ given by the formula:

$$\Delta f = F_R/2^N$$

while admitting that the variation of C is unitarian.

In the applications considered above, in which the device is used in a phase locked loop for restoring the carrier, this variation step is considered very important.

SUMMARY OF THE INVENTION

The invention proposes a device of the type defined in the opening paragraph which thus has a finer variation step for obtaining an output frequency based upon a reference frequency.

Therefore, such a device is characterized in that it comprises an accumulation decoder which, coupled to said accumulator circuit, supplies accumulation information relating to the number accumulated in this accumulator circuit and includes a variable divider circuit controlled by this accumulation information to supply the synthesized frequency signals based upon signals of a reference clock.

According to a preferred embodiment of the invention the accumulation clock signals are formed from synthesized frequency signals. In this manner the advantage is obtained that the operation of the device runs absolutely synchronous with the frequency of the synthesized frequency signals. This makes it possible to model the behaviour of the device, which facilitates its use in complex systems such as said phase control systems.

BRIEF DESCRIPTION OF THE DRAWING

The following description, made with reference to the appended drawings, all given by way of non-limiting example, will make it better understood how the invention may be realised, in which.

DESCRIPTION OF THE PREFERRED EMBODIMENTS

Figure 1:
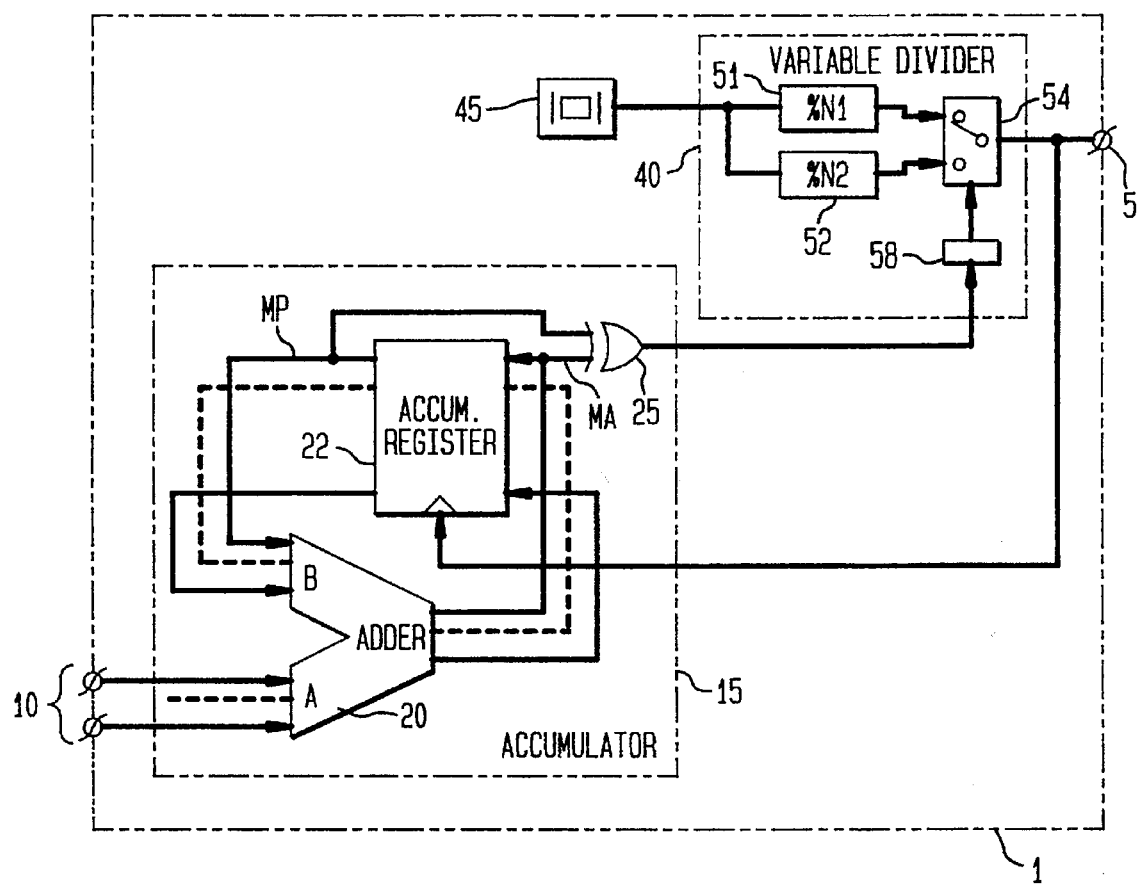
FIG. 1 shows a frequency synthesizing device according to the invention.

In FIG. 1 reference 1 indicates a device according to the invention. This device produces at its output 5 a signal whose frequency is determined by a digital code of, for example, N bits applied to the input terminals 10. This device comprises an accumulator circuit 15 formed by an adder 20 which has two code inputs A and B, and an accumulation register 22. Input A of the adder receives the digital code applied to the terminals 10 and input B is connected to the output of the adder 20 via register 22. An EXCLUSIVE-OR gate 25 serving as an accumulation decoder produces a logic "1" signal to indicate the changing of the value of the most significant bit of the accumulator. Therefore, the inputs of this gate are connected, respectively, to the input line MA and to the output line MP of the register 22 while transmitting the most significant bits.

According to the invention, a signal indicating certain contents of the accumulator circuit which is, for example, supplied at the output of the EXCLUSIVE-OR gate 25, is used for activating a variable divider circuit 40 which has an input connected to a reference oscillator 45 and an output 5 which forms the output of the device 1. Circuit 40 is formed by two fixed dividers 51 and 52 for dividing by $N_1$ and $N_2$, respectively, the frequency of the oscillator 45. The two-position switch 54 connects the signal processed by one of these dividers to output 5. The choice of these positions is determined by the value of the output signal of gate 25. The accumulations take place according to an aspect of the invention in time with the signal present on output 5, which constitutes an accumulation clock signal.

For a better understanding of the purpose of the invention, it is appropriate to utilize the following considerations. Let M be the number of bits processed by the accumulator circuit 15. The N-bit code C on input 10 is such that:

$$0 < C < 2^N - 1.$$

This code is accumulated in the register 22 and causes the change of the value of the most significant bit in k accumulations when:

$$k \cdot C > 2^{m-1}.$$

If $T_u$ is called the period of the signal on output 5, the time interval $T_{SD}$ separating two "1" pulses is given by the relation:

$$T_{SD} = \frac{2^{(M-1)}}{C} \times T_U$$

If there is admitted that if SD=0, one has:

$$F_{U1} = \frac{F_R}{N1} \ ; T_{U1} = \frac{1}{F_{U1}} = \frac{N1}{F_R}$$

and if SD=1:

$$F_{U2} = \frac{F_R}{N2} \ , T_{U2} = \frac{1}{F_{U2}} = \frac{N2}{F_R}$$

a relation is formed between the user frequency $F_U$ and the code C:

During $T_{SD} - T_{U2}$, SD is "0" and the user frequency $F_{U1} = F_R/N1$.

During $T_{U2}$, SD is "1" and the user frequency $F_{U2} = F_R/N2$.

The mean user frequency has the value of:

$$F_U = \frac{1}{T_{SD}} \times \left( \left( (T_{SD} - T_{U2}) \times \frac{F_R}{N1} \right) + T_{U2} \times \frac{F_R}{N2} \right)$$

or finally:

$$F_U = F_R \times \frac{2^{(M-1)}}{C \times (N2 - N1) + 2^{(M-1)} \times N1}$$

It will be observed thus that the variation step $\Delta f$ becomes:

$$\Delta f = \frac{F_R \cdot 2^{(M-1)} \cdot (N1 - N2)}{[C(N2 - N1) + 2^{M-1} \cdot N1]^2}$$

and by choosing N1 and N2 this step is controlled as finely as one wishes.

Figure 2:
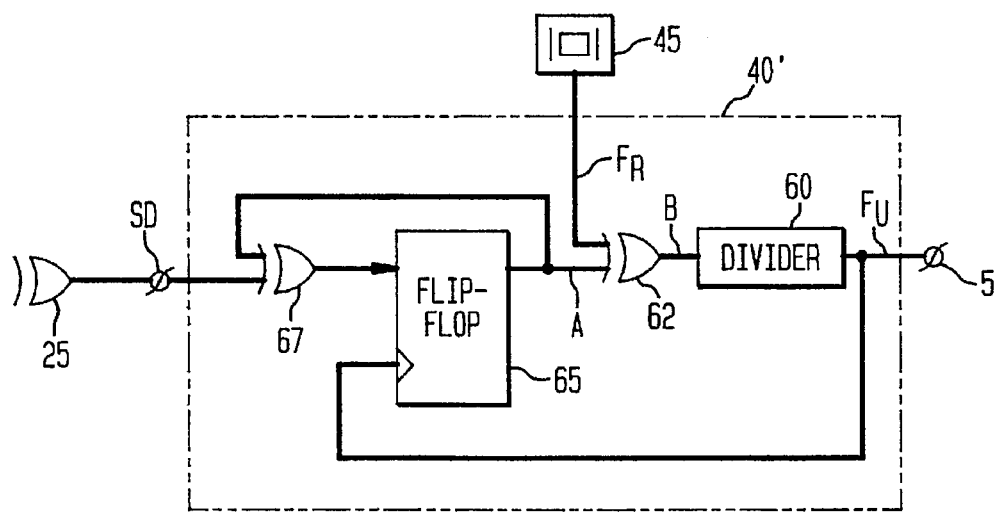
FIG. 2 shows a variant of an embodiment of a variable divider forming a part of a device according to the invention.

FIG. 2 shows an embodiment for a variable divider circuit 40' where N1=16 and N2=15.5, thus well adapted to phase controls. This circuit is formed by a divider 60 which divides by $N_3$ ($N_3$=16) the frequency of the quartz crystal oscillator signals 45 transmitted via an EXCLUSIVE-OR gate 62 which has two inputs of which the first input is connected to the output of the oscillator 45 and the second input is connected to the output of a D-type flip-flop referenced 65. The output of this flip-flop is further connected to an input of another EXCLUSIVE-OR gate 67 of which another input forms the input of this circuit 40' and is thus connected to the output of gate 25. The output of the EXCLUSIVE-OR gate 67 is connected to the input of the flip-flop 65. The input which permits the change of state of this flip-flop is connected to the output of the divider 60.

Figure 3:
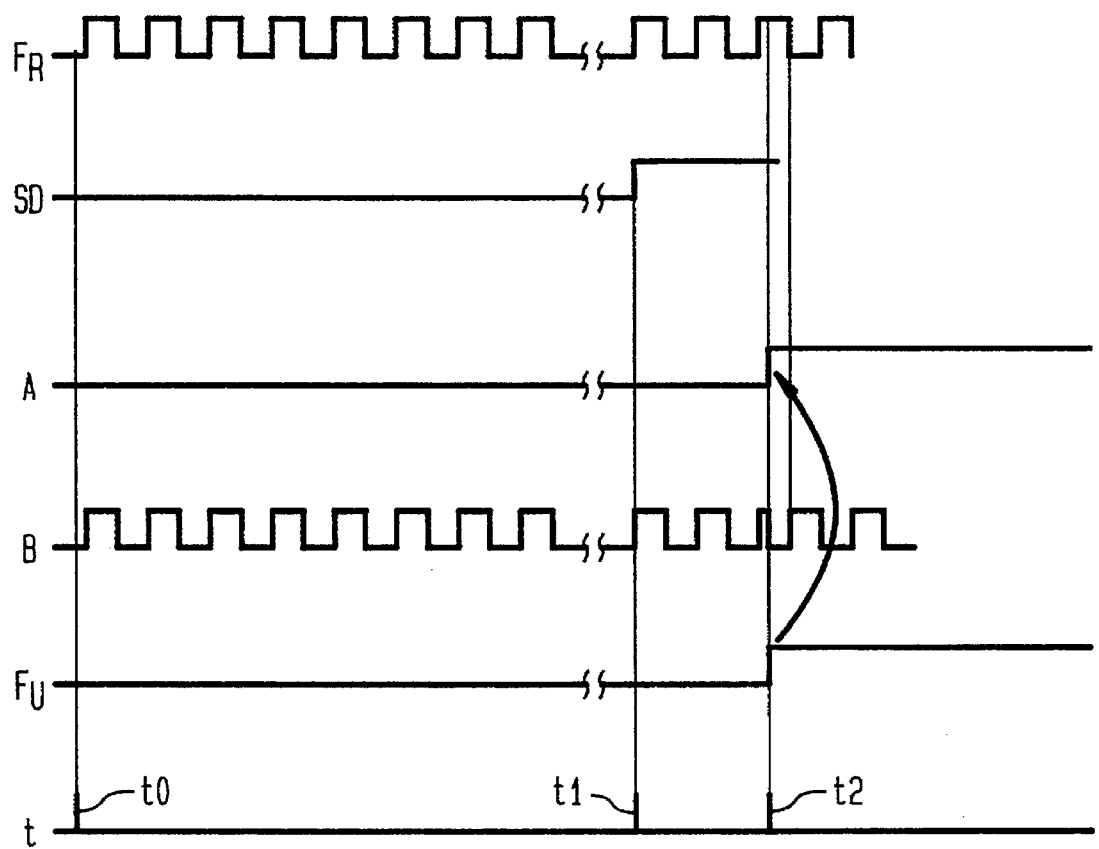
FIG. 3 is a time diagram intended to explain the device shown in FIG. 2.

The operation of this circuit 40' will be explained with the aid of FIG. 3. For this explanation it will be useful to consider the signals, $F_R$, $F_U$, SD, A and B occurring respectively on the outputs of the oscillator 45, divider 60, gate 25, flip-flop 65 and gate 62.

Let us consider instant $t_0$ and assume that signal SD has the "0" value as has signal A. Therefore, signal B is a copy of signal $F_R$. Then one goes to instant $t_1$ where the signal SD assumes the value "1". The signal on the output of the gate 67 is thus inverted to the input of flip-flop 65 which is prepared to change state. This happens at $t_2$ when the divider 60 has finished its counting cycle. Because of this switching, signals B now represent the inverted signals $F_R$. It will be noted that this inversion never coincides with an edge of the signals $F_R$ which is due to the delay caused by the various circuits. In this manner an additional half pulse is created to be divided by the divider 60. If the signal SD retains its value "1", the end of the dividing cycle of this same divider 60 will entail the switching of the flip-flop 65 and hence the creation of a half pulse for the divider 60.

We claim:

1. A frequency synthesizing device comprising:
   an input means for a digital code which defines the frequency to be synthesized, an output for providing synthesized frequency signals, an accumulator circuit coupled to said input means for successively counting the digital codes in the form of numbers in time with signals of an accumulation clock and to said output, an accumulation decoder having a single Exclusive-Or gate, said accumulation decoder being coupled to said accumulator circuit and which supplies accumulation information relating to the number accumulated in said accumulator circuit, and a variable divider circuit controlled by said accumulation information to supply the output with synthesized frequency signals based upon signals of a reference clock.

2. A frequency synthesizing device comprising:
   a reference clock,
   a variable divider circuit coupled to an output of the reference clock,
   input means for a digital code which defines the frequency to be synthesized and an output for providing synthesized frequency signals,
   an accumulator circuit coupled to said input means for counting the digital code and which is synchronized to said synthesized frequency signals;
   an accumulation decoder controlled by said accumulator circuit to supply a control signal related to the digital code for control of the division ratio of the variable divider circuit, whereby the variable divider circuit supplies to said output the synthesized frequency signals which are based upon signals of the reference clock, and said accumulation circuit having
   an adder circuit having a first input coupled to said input means and having a second input,
   an accumulation register having an input coupled to an output of the adder circuit, an output coupled to said second input of the adder circuit and to a first input of the accumulation decoder, and a further input coupled to said output at which the synthesized frequency signals appear, and wherein
   a second input of the accumulation decoder is coupled to an output of the adder circuit.

3. The frequency synthesizing device as claimed in claim 2 wherein said variable divider circuit comprising switching means controlled by said control signal of the accumulation decoder so as to control a ratio of the variable divider circuit.

4. The frequency synthesizing device as claimed in claim 2 wherein said accumulation decoder comprises and Exclusive-Or circuit and said first and second inputs of the accumulation decoder comprise first and second inputs of the Exclusive-Or circuit.

5. A frequency synthesizing device comprising:
   an input for receiving a digital code which defines the frequency to be synthesized,
   an input for receiving a digital code which defines the frequency to be synthesized,
   an output for providing synthesized frequency signals,
   an accumulator circuit for successively counting the digital codes in the form of numbers and in time with said synthesized frequency signals,
   an accumulator decoder coupled to said accumulator circuit for supplying an accumulation signal related to the number accumulated in said accumulator circuit,
   a reference clock for providing reference signals,
   a phase shifter coupled to said reference clock for inverting the phase of said reference signals including a phase control input for receiving said accumulation signal and an output for providing phase shifted signals, and
   a divider for dividing by a fixed amount said phase shifted signals and for providing at said output said synthesized frequency signals, and said phase shifter having
   a first gate circuit having a first input comprising said phase control input,
   a bistable circuit having a input coupled to an output of the first gate circuit, an output coupled to a second input of the first gate circuit and to a first input of a second gate circuit having a second input coupled to said reference clock, and said divider has an input coupled to an output of the second gate circuit and an output terminal coupled to said output of the frequency synthesizing device and to a further input of the bistable circuit.

* * * * *